United States Patent
Chang et al.

(10) Patent No.: US 10,050,102 B2
(45) Date of Patent: Aug. 14, 2018

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Chao-Ching Chang, Kaohsiung (TW); Cheng-Yi Wu, Taichung (TW); Jian-Shin Tsai, Tainan (TW); Min-Hui Lin, Tainan (TW); Yi-Ming Lin, Hsinchu (TW); Chin-Szu Lee, Taoyuan (TW); Wen-Shan Chang, Hsinchu (TW); Yi-Hui Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/996,235

(22) Filed: Jan. 15, 2016

(65) Prior Publication Data
US 2017/0207298 A1     Jul. 20, 2017

(51) Int. Cl.
*H01L 21/02*     (2006.01)
*H01L 49/02*     (2006.01)

(52) U.S. Cl.
CPC .................... *H01L 28/60* (2013.01)

(58) Field of Classification Search
CPC ............. H01L 27/2418; H01L 23/5223; H01L 27/10805; H01L 27/10814; H01L 27/224; H01L 28/60; H01L 21/76898; H01L 21/76802; H01L 21/76843; H01L 21/76849; H01L 21/76885; H01L 21/7682; H01L 21/76879; H01L 21/76877; H01L 23/5226; H01L 23/481; H01L 23/528; H01L 28/40; H01L 28/75; H01L 28/20; H01L 23/53238
See application file for complete search history.

(56) References Cited

U.S. PATENT DOCUMENTS 7,592,220 B2 * 9/2009 Lin ...................... H01L 23/5223
                                                       257/296
7,602,599 B1 * 10/2009 Hsu ........................ H01G 4/005
                                                       361/303

(Continued)

*Primary Examiner* — Yosef Gebreyesus
(74) *Attorney, Agent, or Firm* — JCIPRNET

(57) ABSTRACT

Semiconductor devices and manufacturing method thereof are disclosed. The semiconductor device includes a substrate, a device layer, first and second conductive layers, first and second vias, and a MIM capacitor structure. The substrate includes active and passive regions. The device layer is in the active region. The first conductive layer is over the device layer. The second conductive layer is over the first conductive layer, wherein the first conductive layer is disposed between the device layer and the second conductive layer. The first via electrically connects the first and the second conductive layers. The MIM capacitor structure is between the first and the second conductive layers and in the passive region, and includes first and second electrodes and a capacitor dielectric layer therebetween. The capacitor dielectric layer includes Group IIIA-metal oxide or nitride. The second via electrically connects the second conductive layer and one of the first and second electrodes.

20 Claims, 7 Drawing Sheets

(56) References Cited

U.S. PATENT DOCUMENTS

| | | | | |
|---|---|---|---|---|
| 7,964,470 B2* | 6/2011 | Horng | ................ | H01L 23/5223 |
| | | | | 257/E21.008 |
| 8,298,902 B2* | 10/2012 | Dalton | .............. | H01L 21/76816 |
| | | | | 257/E21.575 |
| 2002/0179951 A1* | 12/2002 | Yoshiyama | ....... | H01L 21/76838 |
| | | | | 257/303 |
| 2006/0148192 A1* | 7/2006 | Chou | .................. | H01L 23/5223 |
| | | | | 438/396 |
| 2006/0252218 A1* | 11/2006 | Abdul-Ridha | ...... | H01L 23/5223 |
| | | | | 438/381 |
| 2007/0034988 A1* | 2/2007 | Won | .................... | H01L 23/5223 |
| | | | | 257/532 |
| 2008/0111237 A1* | 5/2008 | Leavy | ...................... | C25D 5/02 |
| | | | | 257/741 |
| 2011/0108951 A1* | 5/2011 | Cho | ................. | H01L 21/31144 |
| | | | | 257/532 |
| 2012/0091519 A1* | 4/2012 | Tu | ...................... | H01L 23/5223 |
| | | | | 257/303 |
| 2012/0223413 A1* | 9/2012 | Lindert | .............. | H01L 23/5223 |
| | | | | 257/532 |
| 2013/0105981 A1* | 5/2013 | Cooney, III | ........ | H01L 23/5223 |
| | | | | 257/773 |
| 2013/0216924 A1* | 8/2013 | Hillhouse | .............. | H01M 8/04 |
| | | | | 429/408 |
| 2015/0229208 A1* | 8/2015 | Kim | ....................... | H01L 28/87 |
| | | | | 257/299 |

* cited by examiner

SEMICONDUCTOR DEVICE AND MANUFACTURING METHOD THEREOF

BACKGROUND

Advances in technology have resulted in an increasing demand for system-on-chip products where both analog and digital signal processing are desirable. For example, analog circuits capture an analog signal from the surrounding environment and transform the signal into bits which are then transformed into signals for driving digital circuitry and output functions. Increasingly, it is advantageous to have both the analog circuitry and digital circuitry in close proximity, for example, in the form digital blocks and analog blocks of circuitry which function together to implement the function of the system, also referred to as mixed mode systems. For example, MIM capacitors are critical in several mixed signal integrated circuits such as analog frequency tuning circuits, switched capacitor circuits, filters, resonators, up-conversion and down-conversion mixers, and A/D converters.

DETAILED DESCRIPTION

Figure 1:
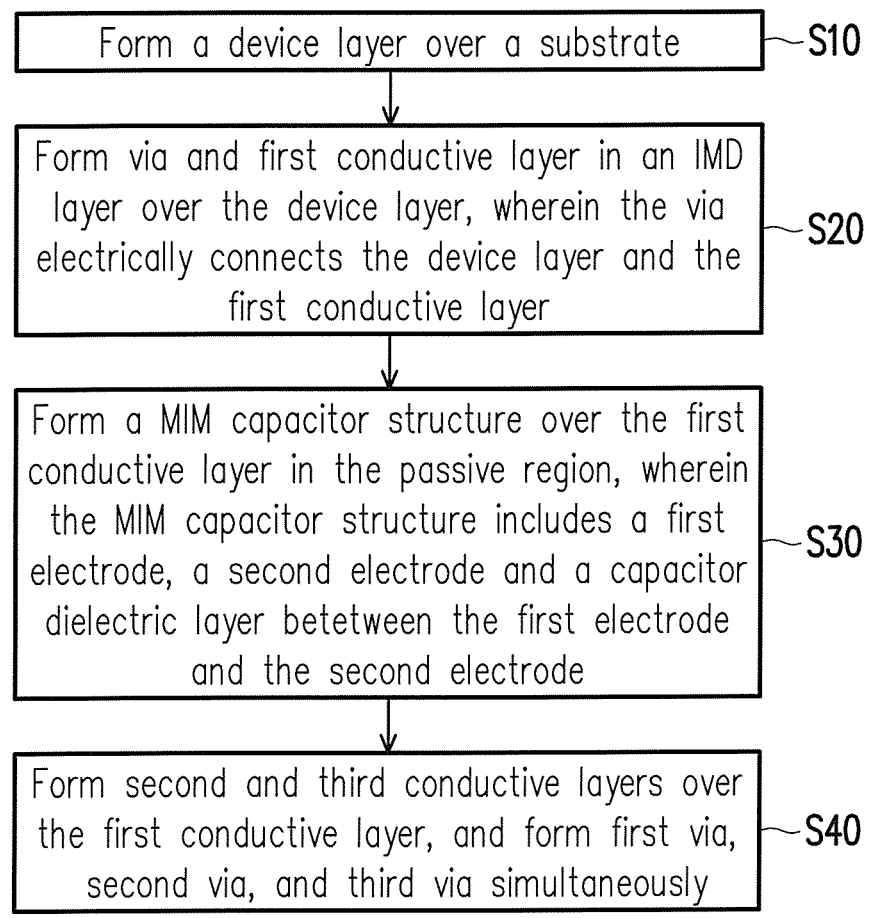
FIG. 1 is a flowchart showing a manufacturing method of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart showing a manufacturing method of a semiconductor device in accordance with some embodiments. FIG. 2A through FIG. 2G are schematic views showing a manufacturing method of a semiconductor device in accordance with some embodiments.

Figure 2A:
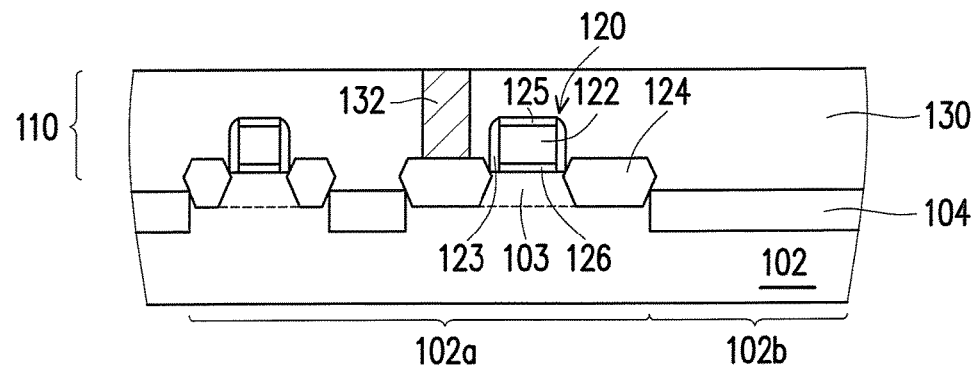
FIG. 2A through FIG. 2G are schematic views showing a manufacturing method of a semiconductor device in accordance with some embodiments.

Referring to FIGS. 1 and 2A, in Step S10, a device layer 110 is formed over a substrate 102. In some embodiments, the substrate 102 is with one or more fins 103 thereon. In some embodiments, the substrate 102 is a semiconductor substrate, such as a silicon substrate, a silicon-on-insulator (SOI) substrate, a silicon germanium substrate, or a substrate formed of other suitable semiconductor materials. Depending on the requirements of design, the substrate 102 may be a P-type substrate or an N-type substrate and may have doped regions (e.g., n-wells and p-wells) formed therein. In some embodiments, the substrate 102 includes an active region 102a and a passive region 102b. In some embodiments, the substrate 102 includes isolation structures 104 defining the active region 102a. The isolation structures 104 are shallow trench isolation (STI) structures, for example. In some embodiments, active devices such as fin-type field effect transistor (FinFET), metal-oxide-semiconductor field-effect transistor (MOSFETs), complementary metal-oxide-semiconductor (CMOS) transistors, high voltage transistors, and/or high frequency transistors; other suitable components; and/or combinations thereof are disposed in the active region 102a. In some embodiments, the passive region 102b is insulating region. In some embodiments, passive components, such as resistors, capacitors, inductors, and/or fuses are disposed in the passive region 102b.

In some embodiments, the device layer 110 includes a transistor 120 and a contact 132 in a dielectric layer 130. In some embodiments, the transistor 120 is over the substrate 102 in the active region 102a. In some embodiments, the transistor 120 is a fin-type field effect transistor (FinFET), for example, and includes a gate 122 and source/drain regions 124. In some embodiments, a gate dielectric layer 126 is formed between the gate 122 and the substrate 102. The gate dielectric layer 126 is made of silicon oxide, high dielectric constant (high-k) material or a combination thereof. In some embodiments, the high-k material has a dielectric constant of greater than about 4 or even greater than about 10. In some embodiments, the high-k material includes metal oxide, such as titanium oxide ($TiO_2$), zirconium oxide ($ZrO_2$), hafnium oxide ($HfO_2$), tantalum oxide ($Ta_2O_5$), barium and strontium titanium oxide ($(Ba,Sr)TiO_3$), a combination thereof or the like. In some embodiments, the gate 122 is a metal gate including metal, metal alloy, metal silicide or a combination thereof. In alternative embodiments, the gate 122 is a polysilicon gate. In some embodiments, spacers 123 are formed on a sidewall of the gate 122 and cap layer 125 is formed over the gate 122. In some embodiments, the source/drain regions 124 are formed beside the gate 122. In some embodiments, the source/drain regions 124 include epitaxial layers (e.g., SiGe or SiC) and/or doped regions therein. In alternative embodiments, a contact etch stop layer (CESL, not shown) is further formed over the gate 122 and the source/drain regions 124. The CESL may include commonly used dielectric materials, such as silicon nitride, silicon oxynitride, silicon oxycarbide, silicon carbide, combinations thereof, multi-layers thereof or the like. Besides stopping an etching process, CESL also applies a stress to the channel regions of the respective MOS devices. For example, CESL portion, which is in NMOS device region, has a tensile stress, while CESL portion, which is in PMOS device region, has a compressive stress. CESL may be closely located to the channel regions to efficiently supply stresses to the channel regions of the respective MOS devices.

In some embodiments, the dielectric layer 130, e.g., an inter-layer dielectric (ILD) layer, is formed over the transistor 120 and the substrate 102. In some embodiments, the contact 132 is formed in the dielectric layer 130 and electrically connected to the transistor 120. In some embodiments, the contact 132 is in contact with at least one of the gate 122 and the source/drain regions 124. In some embodiments, the contact 132 is in contact with one of the source/drain regions 124, for example. In some embodiments, the contact 132 includes conductive material such as W, Cu, Al, an alloy thereof or the like. In some embodiments, the contact 132 is formed by forming a conductive material layer over the dielectric layer 130 and filling in a via opening (not shown) exposing the one of the source/drain regions 124 by suitable processes such as plating, chemical vapor deposition (CVD), physical vapor deposition (PVD) and/or the like, removing the conductive material layer outside the via opening by suitable processes such as CMP, etching and/or the like, and then removing a portion of the conductive material in the via opening by suitable processes such as etchback or the like.

Figure 2B:
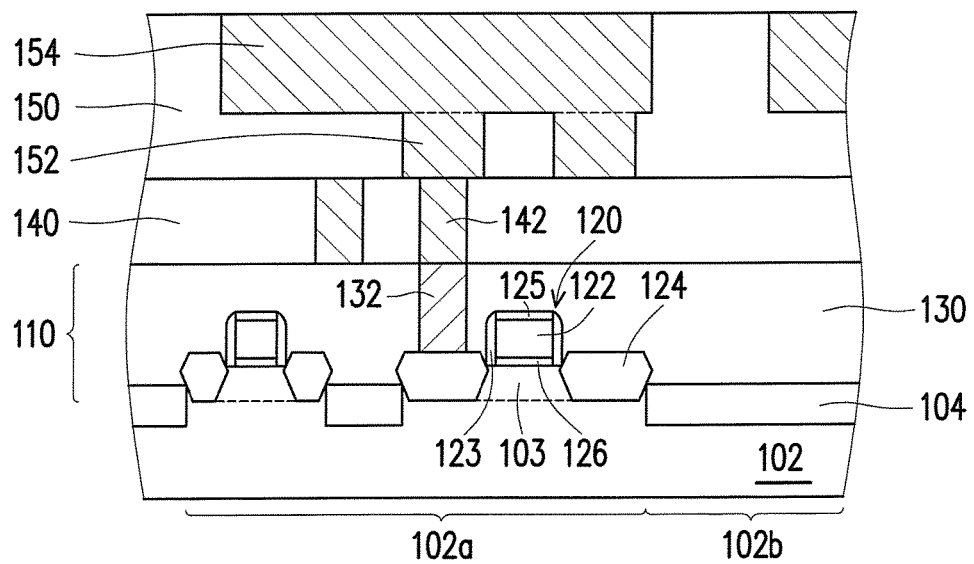

Referring to FIGS. 1 and 2B, in Step S20, via 152 and first conductive layer 154 are formed over the device layer 110, wherein the via 152 electrically connects the device layer 110 and the first conductive layer 154. In some embodiments, the via 152 and the first conductive layer 154 are formed in an inter-metal dielectric (IMD) layer 150. In some embodiments, a via 142 in an IMD layer 140 is formed over the dielectric layer 130 and between the dielectric layer 130 and the IMD layer 150, wherein the via 142 is electrically connected to the device layer 110 through the contact 132. In some embodiments, the IMD layer 150 is, for example, $IMD_n$, the IMD layer 140 is, for example, $IMD_{n-1}$, the via 152 is, for example, $V_{n-1}$ disposed between the $IMD_{n-1}$ and the $IMD_n$, and the first conductive layer 154 is, for example, $M_n$, wherein n is a positive integer larger than 1. In some embodiments, the IMD layer 140, 150 is formed by a suitable process such as spin-coating, CVD, LPCVD, PECVD, HDP-CVD and/or the like. A planarization process, such as a CMP process or the like, may be performed to planarize the IMD layer 140, 150. In some embodiments, a thickness of the IMD layer 140, 150 is from about 300 to 1200 angstroms, for example. In some embodiments, the IMD layer 140, 150 may include a low dielectric constant (low-k) material, a nitride such as silicon nitride, an oxide such as silicon oxide, TEOS, high-density plasma (HDP) oxide, plasma-enhanced TEOS (PETEOS), spin-on glass (SOG), fluorinated silicate glass (FSG), undoped silicate glass (USG), phosphosilicate glass (PSG), borosilicate glass (BSG), boron-doped phosphosilicate glass (BPSG), a combination thereof or the like. In some embodiments, the low-k material has a dielectric constant of less than about 4 or even less than about 3. In some embodiments, the low-k material includes a polymer based material, such as benzocyclobutene (BCB), FLARE®, or SILK®; or a silicon dioxide based material, such as hydrogen silsesquioxane (HSQ) or SiOF. In some embodiments, the IMD layer 140, 150 includes multiple dielectric materials.

In some embodiments, the via 142, 152 and the first conductive layer 154 are formed by sequentially carrying out conventional photolithographic patterning, RIE etching, metal filling, and planarization steps. In some embodiments, the via 142 is formed in the IMD layer 140 by, for example, a damascene process. In some embodiments, the via 152 and the first conductive layer 154 are formed in the IMD layer 150 by, for example, a dual-damascene process. In alternative embodiments, the via 152 and the first conductive layer 154 are formed sequentially and respectively. In some embodiments, a linewidth of the via 142, 152 is, for example, less than about 0.25 microns, including about 0.13 microns. In some embodiment, a material of the via 142, 152 includes copper (Cu), aluminum (Al), AlCu, or tungsten (W). In some embodiment, a material of the via 142, 152 is, for example, copper (Cu). In alternative embodiments, at least one of the via 142, 152 and first conductive layer 154 includes a metal layer and a diffusion barrier layer aside the metal layer. The diffusion barrier layer includes TiW, Ti, TiN, Ta, TaN or a combination thereof, and the metal layer includes W, Cu, Al or an alloy thereof, for example.

Figure 2C:
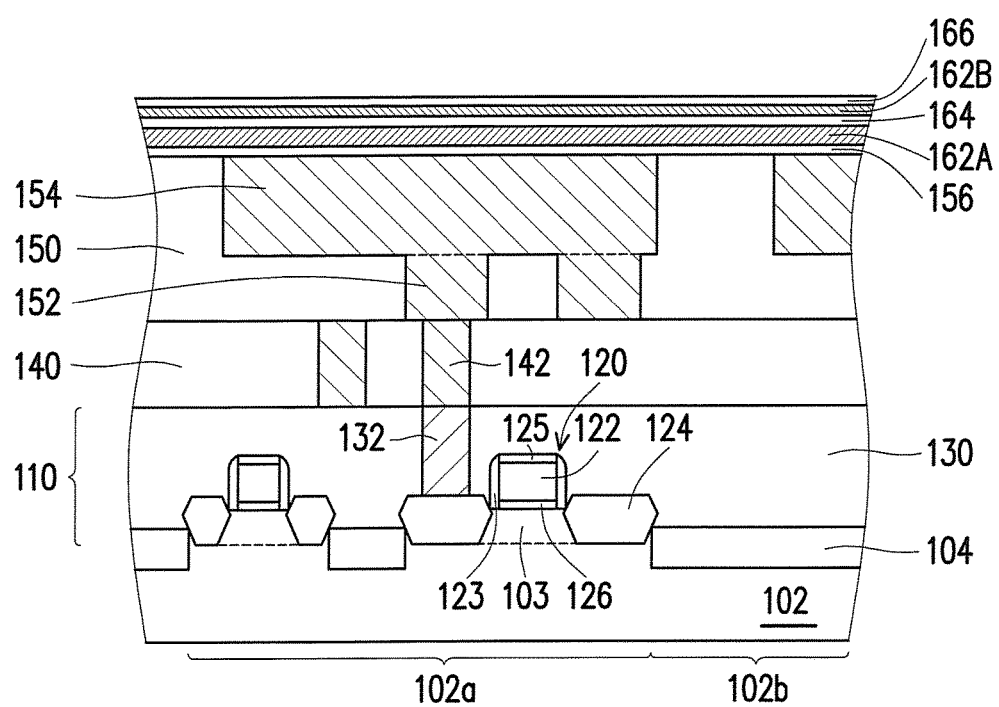
Figure 2D:
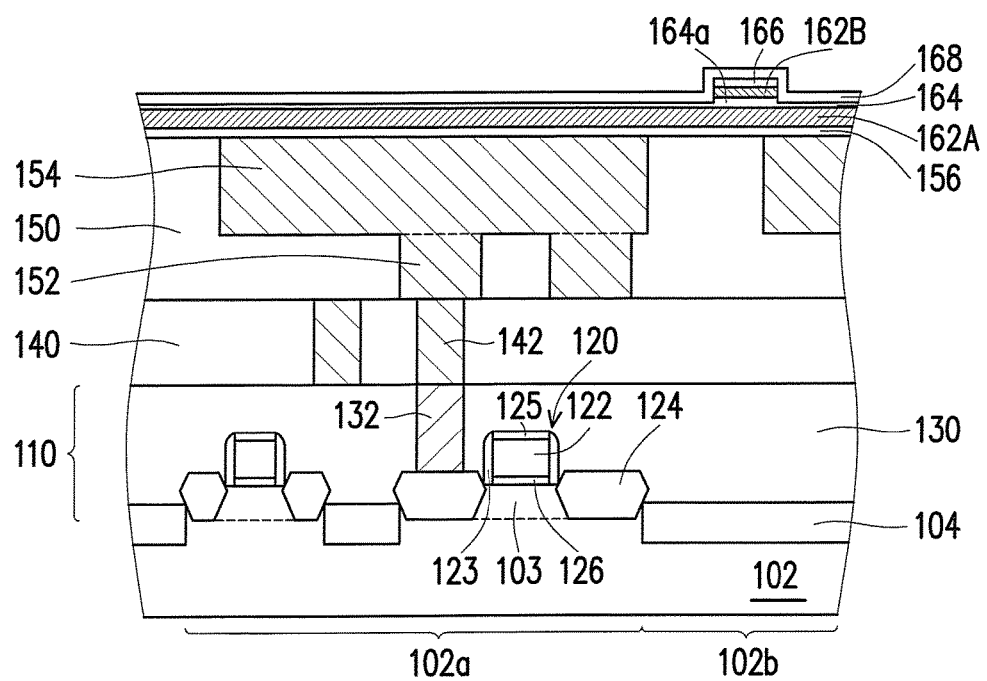
Figure 2E:
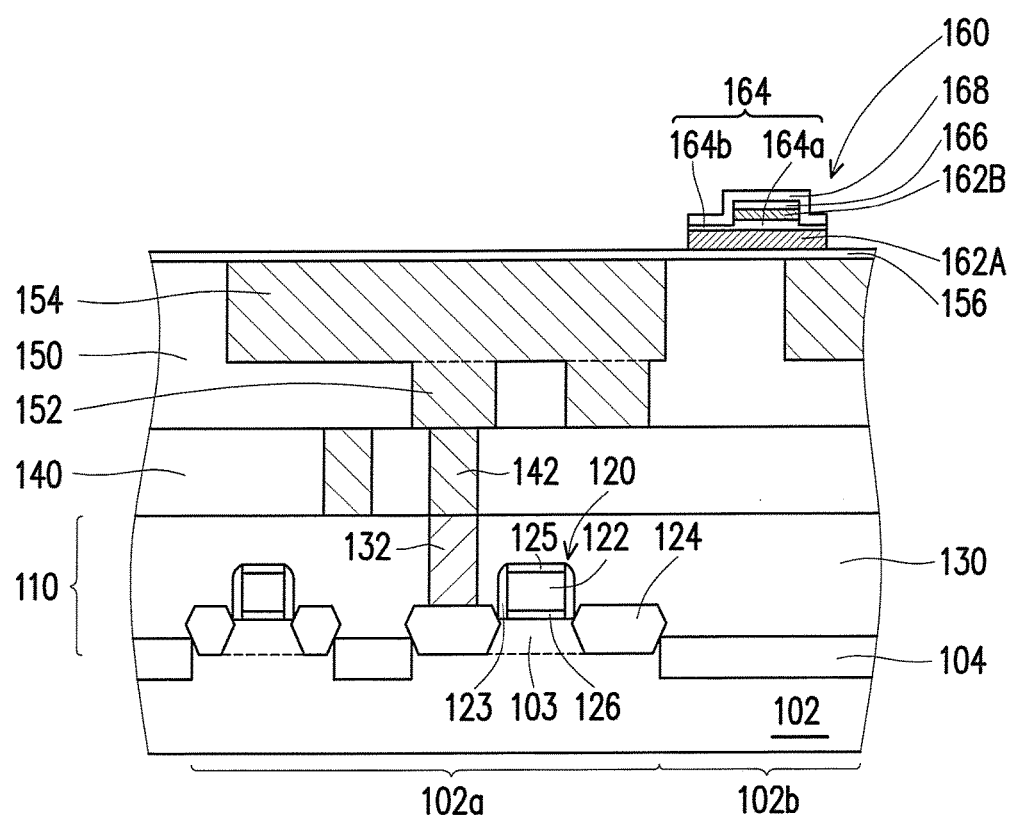

Referring to FIGS. 1 and 2C to 2E, in Step S30, a MIM capacitor structure 160 is formed over the first conductive layer 154 in the passive region 102b, wherein the MIM capacitor structure 160 includes a first electrode 162A, a second electrode 162B and a capacitor dielectric layer 164 between the first electrode 162A and the second electrode 162B. In some embodiment, as shown in FIG. 2C, material layer of the first electrode 162A, material layer of the capacitor dielectric layer 164 and material layer of the second electrode 162B are sequentially formed over the IMD layer 150. In some embodiment, a material layer of an etch stop layer 156 is formed between the IMD layer 150 and the material layer of the first electrode 162A. In some embodiment, a material layer of an anti-reflective layer 166 is formed over the material layer of the second electrode 162B. In some embodiment, then, the material layer of the anti-reflective layer 166 and the material layer of the second electrode 162B are patterned, for example, by using the material layer of the capacitor dielectric layer 164 as an etching stop layer, to define the anti-reflective layer 166 and the second electrode 162B. It is noted that an upper portion of the material layer of the capacitor dielectric layer 164 not covered by the second electrode 162B is also removed, and thus define a first portion 164a of the capacitor dielectric layer 164 having a smaller width than the subsequently formed first electrode 162A. In some embodiment, after that, a material layer of a capping layer 168 is formed over the anti-reflective layer 166 and the second electrode 162B, and covers an upper surface of the material layer of the capacitor dielectric layer 164. In some embodiment, the material layer of the capping layer 168, the material layer of the capacitor dielectric layer 164 and the material layer of the first electrode 162A are patterned, for example, by using the material layer of the etch stop layer 156 as an etching stop layer, to define the capping layer 168, the capacitor dielectric layer 164 and the first electrode 162A. In some embodiment, a second portion 164b of the capacitor dielectric layer 164 is defined and aside the first portion 164a, and has a smaller thickness than the first portion 164a.

In some embodiment, the etch stop layer 156 includes silicon carbide, silicon nitride, TEOS, hard black diamond (HBD), or the like. In some embodiment, the etch stop layer 156 has a thickness ranging from 600 to 900 angstroms. In some embodiment, the first electrode 162A includes Al, AlCu, Ta, TaN, Ti, TiN, W, WN, or the like. In some embodiment, the first electrode 162A includes a lowermost layer of a metal nitride, an interlayer of a metal layer and an uppermost layer of a metal nitride. For example, a first metal nitride layer such as a TaN layer is deposited by a sputter deposition method such as an ion metal plasma (IMP), followed by sputter deposition of a metal layer such as an AlCu layer, and followed by deposition of a second metal nitride layer such as a TaN layer. The overall thickness of the first electrode 162A is between about 1000 to 4000 angstroms, depending on the IC application of the MIM capacitor structure 160. For example, the first metal nitride layer of the first electrode 162A may range from about 400 to 800 angstroms, the metal layer of the first electrode 162A may range from about 800 to 1600 angstroms, and the second metal nitride layer of the first electrode 162A may range from about 100 to 300 angstroms.

In some embodiment, the capacitor dielectric layer 164 is formed by atomic layer deposition (ALD) method. The capacitor dielectric layer 164 includes Group IIIA-metal oxide or nitride such as aluminum nitride (AlN), gallium nitride (GaN), indium nitride (InN), tantalum oxide ($Ta_2O_5$), hafnium oxide ($HfO_2$), a combination thereof or the like. In some embodiment, the capacitor dielectric layer 164 has a better breakdown voltage (Vbd) performance compared with the conventional material of the capacitor dielectric layer such as silicon oxide, silicon nitride or the like. In some embodiment, a thickness of the capacitor dielectric layer 164 is smaller than 1500 angstroms. In some embodiment, a thickness of the capacitor dielectric layer 164 ranges from about 5 to 400 angstroms. In some embodiment, a thickness of the capacitor dielectric layer 164 ranges from about 5 to 200 angstroms. In some embodiment, a thickness of the capacitor dielectric layer 164 ranges from about 5 to 100 angstroms. In some embodiment, a thickness of the capacitor dielectric layer 164 ranges from about 5 to 50 angstroms. It is noted that since the capacitor dielectric layer 164 has good breakdown voltage and capacitance and is formed by ALD method, the capacitor dielectric layer 164 may have good performance even with a small thickness such as about 5 to 50 angstroms. In some embodiment, the capacitor dielectric layer 164 includes aluminum nitride (AlN). In some embodiment, a ratio of a thickness of the first portion 164a and the second portion 164b ranges from about 3:1 to 10:1. In some embodiments, the first portion 164a of the capacitor dielectric layer 164 is in contact with the first and second electrodes 162A, 162B and the second portion 164b of the capacitor dielectric layer 164 is in contact with the capping layer 168 and one of the first and second electrodes 162A, 162B. In some embodiments, the second portion 164b is in contact with the capping layer 168 and the first electrode 162A.

In some embodiment, the second electrode 162B is deposited by conventional sputter deposition techniques such as ion metal plasma (IMP). The second electrode 162B includes Al, AlCu, Ta, TaN, Ti, TiN, W, WN, or the like. In some embodiment, the second electrode 162B includes TaN. In some embodiment, a thickness of the second electrode 162B ranges from 600 to 1000 angstroms. In some embodiment, the anti-reflective layer 166 includes silicon nitride (e.g., $SiO_2$) or silicon oxynitride (e.g., SiON), and the anti-reflective layer 166 improves a subsequent photolithographic patterning process to define etching pattern of the second electrode 162B.

In some embodiment, the capping layer 168 functions as a subsequent etch stop layer and as an electrode passivation layer. In some embodiment, the capping layer 168 includes silicon oxynitride (e.g., SiON) or silicon nitride (e.g., SiN). In some embodiment, the capping layer 168 is deposited by conventional means, for example, PECVD or HDP-CVD. In some embodiment, the capping layer 168 has a thickness of about 100 to 800 angstroms. In alternative embodiment, the anti-reflective layer 166 and/or the capping layer 168 may be omitted.

Figure 2F:
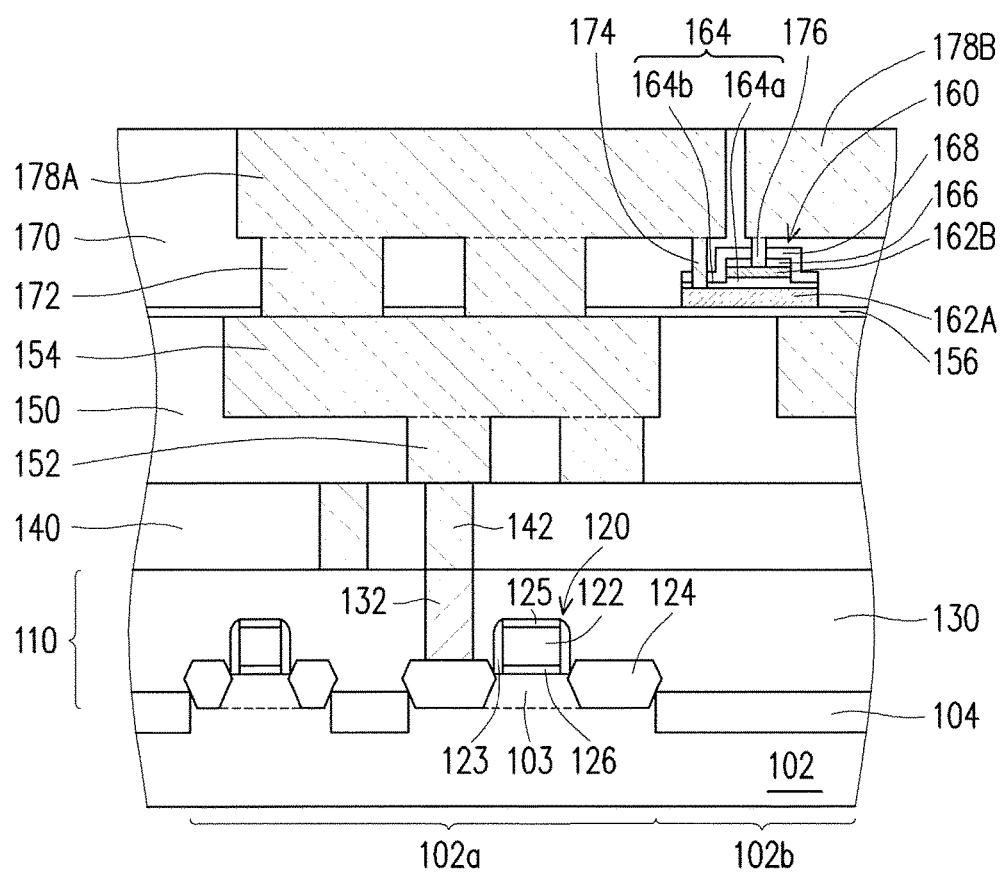

Referring to FIGS. 1 and 2F and, in Step S40, second and third conductive layers 178A, 178B are formed over the first conductive layer 154, and first via 172, second via 174, and third via 176 are formed simultaneously. In some embodiments, an IMD layer 170, e.g., $IMD_{n+1}$, is formed over the first conductive layer 154 and covers the MIM capacitor structure 160. In some embodiments, then, the first via 172, the second via 174, and the third via 176 are formed in the IMD layer 170 and over the first conductive layer 154, the first electrode 162A and the second electrode 162B respectively, and formed simultaneously with the second and third conductive layers 178A, 178B by, for example, a dual-damascene process. In some embodiments, the second and third conductive layers 178A, 178B are electrically separated. In alternative embodiments, the first, second and third vias 172, 174, 176 and the second and third conductive layers 178A, 178B are formed sequentially and respectively. In some embodiments, the first via 172 electrically connects the first and second conductive layers 154, 178A, the second via 174 electrically connects the second conductive layer 178A and the first electrode 162A, and the third via 176 electrically connects the third conductive layer 178B and the second electrode 162B. In some embodiments, the first via 172 is disposed between and in contact with the first conductive layer 154 and the second conductive layer 178A. In some embodiments, the second via 174 is disposed between and in contact with the second conductive layer 178A and the first electrode 162A, and penetrates through the capping layer 168 and the second portion 164b of the capacitor dielectric layer 164. In some embodiments, the third via 176 is disposed between and in contact with the third conductive layer 178B and the second electrode 162B, and penetrates through the capping layer 168 and the anti-reflective layer 166. In some embodiment, the MIM capacitor structure 160 is disposed between the first conductive layer 154 and the second conductive layer 178A and the first conductive layer 154 and the third conductive layer 178B. In some embodiment, the MIM capacitor structure 160 is designed to have a height smaller than a height of the first via 172 to be formed and between the first conductive layer 154 and the second conductive layer 178A, and thus the second via 174 and the third via 176 may be formed simultaneously with the first via 172. In some embodiment, the IMD layer 170 is deposited in a similar manner using similar materials as outlined above with respect to the IMD layer 140, 150, followed by planarization of the upper portion of IMD layer 170 by a CMP process. An anti-reflective layer (not shown) may be optionally deposited to improve a subsequent via patterning process.

Figure 2G:
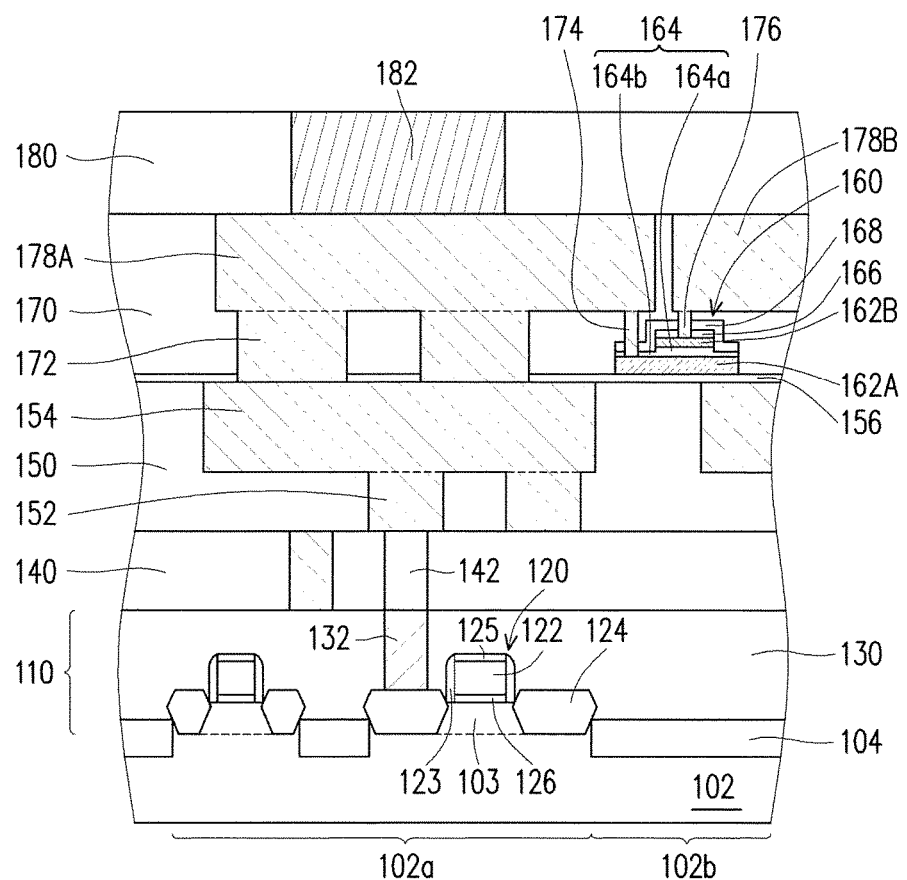

Referring to FIGS. 1 and 2G, a bonding pad 182 in a passivation layer 180 is formed over the second conductive layers 178A. In some embodiments, the second conductive layers 178A is, for example, the top metal layer. In some embodiments, the bonding pad 182 includes a metal material (e.g., Cu, Al or an alloy thereof) and a diffusion barrier material (e.g., TiCu, Ti, TiN, Ta, TaN or a combination thereof) aside and below the metal material. The bonding pad 182 is formed by suitable processes such as plating or CVD combined with photolithography etching steps. In some embodiments, the passivation layer 180 includes silicon oxide, benzocyclobutene (BCB) polymer, polyimide (PI), polybenzoxazole (PBO) or a combination thereof and is formed by a suitable process such as spin coating, CVD or the like.

In some embodiments, the capacitor dielectric layer of the MIM capacitor structure includes Group IIIA-metal oxide or nitride such as aluminum nitride (AlN), gallium nitride (GaN), indium nitride (InN), tantalum oxide ($Ta_2O_5$), hafnium oxide ($HfO_2$) or a combination thereof. Compared with the conventional material of the capacitor dielectric layer such as silicon oxide and silicon nitride, the capacitor dielectric layer in some embodiments has good breakdown voltage and capacitance. Additionally, in some embodiments, the capacitor dielectric layer includes Group IIIA-metal oxide or nitride and is formed by ALD method, and thus the capacitor dielectric layer has a desired performance even with a small thickness ranging from about 5 to 50 angstrom. In some embodiment, the capacitor dielectric layer has the first portion between the first electrode and the second electrode, and the second portion disposed aside the first portion and between the capping layer and the first electrode. In some embodiment, the second portion is used as an etching stop layer during patterning the second electrode, and thus the first electrode underlying the second portion of the capacitor dielectric layer is protected from being damaged and insulated from the second electrode. Accordingly, the MIM capacitor structure has good performance. Furthermore, the MIM capacitor structure is formed in the passive region rather than the active region, and thus no active components or devices are located directly underlying the MIM capacitor structure. Accordingly, the influence of parasitic electrical effect on the electrical behavior of the MIM capacitor structure is reduced.

A semiconductor device includes a substrate, a device layer, a first conductive layer, a second conductive layer, a first via, a MIM capacitor structure, and a second via. The substrate includes an active region and a passive region. The device layer is in the active region. The first conductive layer is over the device layer. The second conductive layer is over the first conductive layer, wherein the first conductive layer is disposed between the device layer and the second conductive layer. The first via electrically connects the first conductive layer and the second conductive layer. The MIM capacitor structure is between the first conductive layer and the second conductive layer and in the passive region, and includes a first electrode, a second electrode and a capacitor dielectric layer between the first electrode and the second electrode, wherein a material of the capacitor dielectric layer includes Group IIIA-metal oxide or nitride. The second via electrically connects the second conductive layer and one of the first electrode and the second electrode.

A semiconductor device includes a device layer, a first conductive layer, a first via, a MIM capacitor structure, and a second via. The first conductive layer is over the device layer. The first via electrically connects the device layer and the first conductive layer. The MIM capacitor structure includes a first electrode, a second electrode, a capacitor dielectric layer between the first electrode and the second electrode, and a capping layer over the first electrode, the capacitor dielectric layer and the second electrode, wherein a material of the capacitor dielectric layer includes Group IIIA-metal oxide or nitride. The second via electrically connects the first conductive layer and one of the first electrode and the second electrode, wherein a first portion of the capacitor dielectric layer is in contact with the first and second electrodes, and a second portion of the capacitor dielectric layer is in contact with the capping layer and the one of the first and second electrodes and aside the first portion.

A manufacturing method of a semiconductor device includes the following. A device layer is formed over a substrate. A first conductive layer is formed over the device layer. Second and third conductive layers are formed over the first conductive layer. A MIM capacitor structure is formed between the first conductive layer and the second conductive layer, wherein the MIM capacitor structure includes a first electrode, a second electrode and a capacitor dielectric layer between the first electrode and the second electrode. First via, second via, and third via are simultaneously formed, wherein the first via electrically connects the first and second conductive layers, the second via electrically connects the second conductive layer and the first electrode, and the third via electrically connects the third conductive layer and the second electrode.

The foregoing outlines features of several embodiments so that those skilled in the art may better understand the aspects of the present disclosure. Those skilled in the art should appreciate that they may readily use the present disclosure as a basis for designing or modifying other processes and features for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate, including an active region and a passive region;
   a device layer in the active region;
   a first conductive layer over the device layer;
   a second conductive layer over the first conductive layer, wherein the first conductive layer is disposed between the device layer and the second conductive layer;
   a first via electrically connecting and in physical contact with the first conductive layer and the second conductive layer;
   a MIM capacitor structure, between the first conductive layer and the second conductive layer in the passive region, and comprising a first electrode, a second electrode and a capacitor dielectric layer between the first electrode and the second electrode, wherein the first via and the MIM capacitor structure are disposed between a top surface of the first conductive layer and a bottom surface of the second conductive layer, the first conductive layer is an i-th metal layer, the second conductive layer is an (i+1)-th metal layer, and i is a positive integer; and
   a second via electrically connecting the second conductive layer and one of the first electrode and the second electrode.

2. The semiconductor device of claim 1, wherein the capacitor dielectric layer includes aluminum nitride, gallium nitride, indium nitride, tantalum oxide, hafnium oxide or a combination thereof.

3. The semiconductor device of claim 1, wherein a thickness of the capacitor dielectric layer ranges from about 5 to 50 angstroms.

4. The semiconductor device of claim 1, wherein the first via is disposed between and in contact with the first conductive layer and the second conductive layer, the second via is disposed between and in contact with the one of the first electrode and the second electrode and the second conductive layer.

5. The semiconductor device of claim 4, wherein a height of the MIM capacitor structure is smaller than a height of the second via.

6. The semiconductor device of claim 1, further comprising a capping layer covering the first electrode, the capacitor dielectric layer and the second electrode.

7. The semiconductor device of claim 1, further comprising an anti-reflective layer over the first electrode, the capacitor dielectric layer and the second electrode.

8. The semiconductor device of claim 1, further comprising a bonding pad over and in contact with the second conductive layer.

9. The semiconductor device of claim 1, wherein the MIM capacitor structure further comprises a capping layer over the first electrode, the capacitor dielectric layer and the second electrode, a first portion of the capacitor dielectric layer is in contact with the first and second electrodes, a second portion of the capacitor dielectric layer is aside the first portion, in contact with the first electrode and not in contact with the second electrode, and the capping layer is disposed on and in direct contact with an upper surface of the second portion, an entire sidewall of the first portion and an entire sidewall of the second electrode.

10. A semiconductor device comprising:
a device layer;
a first conductive layer over the device layer;
a first via electrically connecting the device layer and the first conductive layer;
a MIM capacitor structure, comprising a first electrode, a second electrode, a capacitor dielectric layer between the first electrode and the second electrode, and a capping layer over the first electrode, the capacitor dielectric layer and the second electrode, wherein a material of the capacitor dielectric layer includes Group IIIA-metal oxide or nitride; and
a second via electrically connecting the first conductive layer and the first electrode, wherein a first portion of the capacitor dielectric layer is in contact with the first and second electrodes, and a second portion of the capacitor dielectric layer is aside the first portion, is in contact with the first electrode, and is not in contact with the second electrode, and the capping layer is disposed on and in direct contact with an upper surface of the second portion, an entire sidewall of the first portion and an entire sidewall of the second electrode.

11. The semiconductor device of claim 10, wherein the capacitor dielectric layer includes aluminum nitride, gallium nitride, indium nitride, tantalum oxide, hafnium oxide or a combination thereof.

12. The semiconductor device of claim 10, wherein a ratio of a thickness of the first portion and the second portion ranges from about 3:1 to 10:1.

13. The semiconductor device of claim 10, wherein a thickness of the capacitor dielectric layer ranges from about 5 to 50 angstroms.

14. The semiconductor device of claim 10, further comprising a second conductive layer and a third via electrically connecting the second conductive layer and the second electrode.

15. The semiconductor device of claim 10, further comprising an anti-reflective layer between the capping layer and the first electrode, the capacitor dielectric layer and the second electrode.

16. A manufacturing method of a semiconductor device comprising:
forming a device layer over a substrate;
forming a first conductive layer over the device layer;
forming second and third conductive layers over the first conductive layer;
forming a MIM capacitor structure between the first conductive layer and the second conductive layer, wherein the MIM capacitor structure includes a first electrode, a second electrode, a capacitor dielectric layer between the first electrode and the second electrode and a capping layer over the first electrode, the capacitor dielectric layer and the second electrode, a material of the capacitor dielectric layer includes Group IIIA-metal oxide or nitride, and a first portion of the capacitor dielectric layer is in contact with the first and second electrodes, and a second portion of the capacitor dielectric layer is aside the first portion, in contact with the first electrode, and not in contact with the second electrode, and the capping layer is disposed on and in direct contact with an upper surface of the second portion, an entire sidewall of the first portion and an entire sidewall of the second electrode; and
forming first via, second via, and third via simultaneously, wherein the first via electrically connects the first and second conductive layers, the second via electrically connects the second conductive layer and the first electrode, and the third via electrically connects the third conductive layer and the second electrode.

17. The method of claim 16, wherein the capacitor dielectric layer is formed by atomic layer deposition (ALD) method.

18. The method of claim 16, wherein the second and third conductive layers and the first via, second via, and third via are formed simultaneously.

19. The method of claim 16, wherein a forming method of the MIM capacitor structure comprises:
forming a first electrode material layer;
forming a capacitor dielectric material layer over the first electrode material layer;
forming a second electrode material layer over the capacitor dielectric material layer;
patterning the second electrode material layer to form the second electrode; and
patterning the capacitor dielectric material layer and the first electrode material layer to form the capacitor dielectric layer and the first electrode.

20. The method of claim 19, wherein the second electrode material layer is patterned by using the capacitor dielectric material layer as an etching stop layer.

* * * * *